US009034755B2

(12) United States Patent
Alptekin et al.

(10) Patent No.: US 9,034,755 B2
(45) Date of Patent: May 19, 2015

(54) METHOD OF EPITAXIALLY FORMING CONTACT STRUCTURES FOR SEMICONDUCTOR TRANSISTORS

(71) Applicant: International Business Machines Corporation, Armonk, NY (US)

(72) Inventors: Emre Alptekin, Wappingers Falls, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/096,243

(22) Filed: Dec. 4, 2013

(65) Prior Publication Data

US 2014/0094014 A1    Apr. 3, 2014

Related U.S. Application Data

(62) Division of application No. 13/330,817, filed on Dec. 20, 2011, now Pat. No. 8,853,862.

(51) Int. Cl.

| H01L 21/00 | (2006.01) |
|---|---|
| H01L 21/4763 | (2006.01) |
| H01L 21/44 | (2006.01) |
| H01L 21/311 | (2006.01) |
| H01L 29/66 | (2006.01) |

(Continued)

(52) U.S. Cl.
CPC ...... *H01L 29/665* (2013.01); *H01L 21/823425* (2013.01); *H01L 21/823475* (2013.01); *H01L 21/823814* (2013.01); *H01L 21/823871* (2013.01); *H01L 21/76889* (2013.01); *H01L 21/28525* (2013.01); *H01L 23/485* (2013.01); *H01L 23/53271* (2013.01); *H01L 21/76804* (2013.01); *H01L 2924/0002* (2013.01)

(58) Field of Classification Search
None
See application file for complete search history.

(56) References Cited

U.S. PATENT DOCUMENTS

| 5,312,768 A | 5/1994 | Gonzalez |
|---|---|---|
| 6,137,149 A | 10/2000 | Kodama |

(Continued)

FOREIGN PATENT DOCUMENTS

| KR | 20030048210 A | 6/2003 |
|---|---|---|
| KR | 20060041514 A | 5/2006 |

(Continued)

OTHER PUBLICATIONS

International Application No. PCT/US2012/058514 filed Oct. 3, 2012 PCT International Search Report and Written Opinion.

*Primary Examiner* — Mamadou Diallo
*Assistant Examiner* — Jay C Chang
(74) *Attorney, Agent, or Firm* — Yuanmin Cai

(57) ABSTRACT

Embodiments of the present invention provide a method of forming contact structure for transistor. The method includes providing a semiconductor substrate having a first and a second gate structure of a first and a second transistor formed on top thereof, the first and second gate structures being embedded in a first inter-layer-dielectric (ILD) layer; epitaxially forming a first semiconductor region between the first and second gate structures inside the first ILD layer; epitaxially forming a second semiconductor region on top of the first semiconductor region, the second semiconductor region being inside a second ILD layer on top of the first ILD layer and having a width wider than a width of the first semiconductor region; and forming a silicide in a top portion of the second semiconductor region.

8 Claims, 14 Drawing Sheets

(51) Int. Cl.
H01L 21/8234 (2006.01)
H01L 21/8238 (2006.01)
H01L 21/768 (2006.01)
H01L 21/285 (2006.01)
H01L 23/485 (2006.01)
*H01L 21/02* (2006.01)
*H01L 23/48* (2006.01)
*H01L 23/52* (2006.01)
*H01L 29/40* (2006.01)
*H01L 23/532* (2006.01)

(56) References Cited

U.S. PATENT DOCUMENTS

| | | | |
|---|---|---|---|
| 6,248,637 | B1 | 6/2001 | Yu |
| 6,313,040 | B1 | 11/2001 | Beghin et al. |
| 6,465,312 | B1 | 10/2002 | Yu |
| 6,890,823 | B2 | 5/2005 | Lee et al. |
| 7,663,192 | B2 | 2/2010 | Sell et al. |
| 7,851,283 | B2 | 12/2010 | Anderson et al. |
| 2001/0026987 | A1* | 10/2001 | Fazan et al. .................... 438/381 |
| 2002/0008261 | A1* | 1/2002 | Nishiyama .................... 257/288 |
| 2003/0087512 | A1* | 5/2003 | Cheong ....................... 438/595 |
| 2003/0164513 | A1 | 9/2003 | Ping et al. |
| 2004/0102039 | A1 | 5/2004 | Lim et al. |
| 2007/0001235 | A1 | 1/2007 | Rhodes |
| 2007/0105297 | A1* | 5/2007 | Jeong et al. ................. 438/197 |
| 2007/0108514 | A1 | 5/2007 | Inoue et al. |
| 2010/0330755 | A1 | 12/2010 | Hsiao et al. |
| 2011/0042729 | A1 | 2/2011 | Chen et al. |
| 2011/0133265 | A1 | 6/2011 | Derderian et al. |
| 2011/0201164 | A1 | 8/2011 | Chung et al. |

FOREIGN PATENT DOCUMENTS

| | | |
|---|---|---|
| KR | 100671563 B1 | 1/2007 |
| KR | 20100076697 A | 7/2010 |
| WO | WO0193326 A1 | 12/2001 |

* cited by examiner

METHOD OF EPITAXIALLY FORMING CONTACT STRUCTURES FOR SEMICONDUCTOR TRANSISTORS

CROSS-REFERENCE TO RELATED APPLICATION

This is a divisional application of U.S. patent application Ser. No. 13/330,817 filed Dec. 20, 2011.

FIELD OF THE INVENTION

The present invention relates generally to the field of semiconductor device manufacturing and in particular relates to contact structures for semiconductor transistors and method of making the same.

BACKGROUND

In the field of semiconductor device manufacturing, active semiconductor devices such as, for example, transistors are generally manufactured or fabricated through processes commonly known as front end of line (FEOL) technologies. A transistor may be, for example, a field-effect-transistor (FET) and may be more specifically a complementary metal-oxide-semiconductor (CMOS) FET. A FET may also be a p-type dopant doped PFET or an n-type dopant doped NFET. Recently, high-k metal gate (HKMG) semiconductor transistors have been introduced because of their superior performance over conventional poly-based CMOS-FET. In addition, a replacement metal gate (RMG) process has been developed to further enhance the performance of HKMG transistors.

Generally, after structure of a transistor is formed, conductive contacts are formed to connect to source, drain, and/or gate of the transistor to make the transistor fully functional. With the continuous scaling down in device dimension in integrated circuitry, real estate for forming corresponding contacts is also becoming smaller and smaller.

As device dimensions scale, silicide to source-drain resistance (interface resistivity times contact length) increases with the inverse of the source/drain contact length. Silicide to source-drain interface resistivity is determined by the interface doping concentration, which is limited by the doping solid solubility and the barrier height, which itself is determined by the choice of the metal. Known solutions to scaling interface resistivity include using rare earth metals, which have a reduced barrier height to a specific type of carrier, and dopant segregation techniques, which "pile up" dopants at the contact interface in order to increase the electric field at the contact interface, in turn reducing the contact barrier height. Since there is an upper limit to the dopant solubility and a lower limit to the achievable contact barrier height with dopant pile-up techniques (typically zero or near zero), there necessarily exists a limit to the interface resistivity. Also, as the device pitch scales down, so does the the contact area, which means that the interface resistivity must scale by at least the same amount in order to preserve the same percent-wise contribution of contact resistance to the total on-state resistance. Eventually, this will no longer be possible, due to the limitations mentioned above, at which point the contact resistance is expected to dominate. Therefore, for a given device dimension, methods to increase the silicide contact area is increasingly critical for future nodes, in light of the need to minimize contact resistance due to the increased role that contact resistance plays in the total on-state resistance in aggressively scaled MOSFETs.

SUMMARY

Embodiments of the present invention provide a contact structure for transistor, which includes a first epitaxial-grown region between a first and a second gate of, respectively, a first and a second transistor with the first epitaxial-grown region having a first width; a second epitaxial-grown region directly on top of the first epitaxial-grown region with the second epitaxial-grown region having a second width that is wider than the first width of the first epitaxial-grown region; and a silicide region formed on a top portion of the second epitaxial-grown region, the silicide region having an interface with rest of the second epitaxial-grown region, the interface being wider than the first width of the first epitaxial-grown region.

In one embodiment, the interface between the silicide region and rest of the second epitaxial-grown region has multiple facets to have a total combined width that is wider than the second width of the second epitaxial-grown region.

In another embodiment, the interface between the silicide region and rest of the second epitaxial-grown region is curved or has a curve shape to have a width, measured along the curved interface, wider than the second width of the second epitaxial-grown region.

According to one embodiment, the first epitaxial-grown region is on top of a source/drain region of both the first transistor and the second transistor, and the second epitaxial-grown region is at a level above a top surface of the first and second gates of the first and second transistors.

In one embodiment, the second epitaxial-grown region is at least partially on top of a spacer next to a sidewall of the first gate of the first transistor and at least partially on top of a spacer next to a sidewall of the second gate of the second transistor. In another embodiment, the second epitaxial-grown region is at least partially on top of the first gate of the first transistor and at least partially on top of the second gate of the second transistor.

According to one embodiment, the first epitaxial-grown region and the second epitaxial-grown region are insulated from the first and second gates of the first and second transistors by a dielectric layer.

In one embodiment, the second epitaxial-grown region has a top surface and a bottom surface that is smaller than the top surface, wherein the bottom surface is a same size as a top surface of the first epitaxial-grown region and gradually increases in size, along a height of the second epitaxial-grown region, to become a same size as the top surface.

In another embodiment, the second epitaxial-grown region has a top surface and a bottom surface, the top and bottom surfaces are same in size and are wider than a top surface of the first epitaxial-grown region.

BRIEF DESCRIPTION OF THE DRAWINGS

The present invention will be understood and appreciated more fully from the following detailed description of preferred embodiments, taken in conjunction with the accompanying drawings of which.

Figure 1:
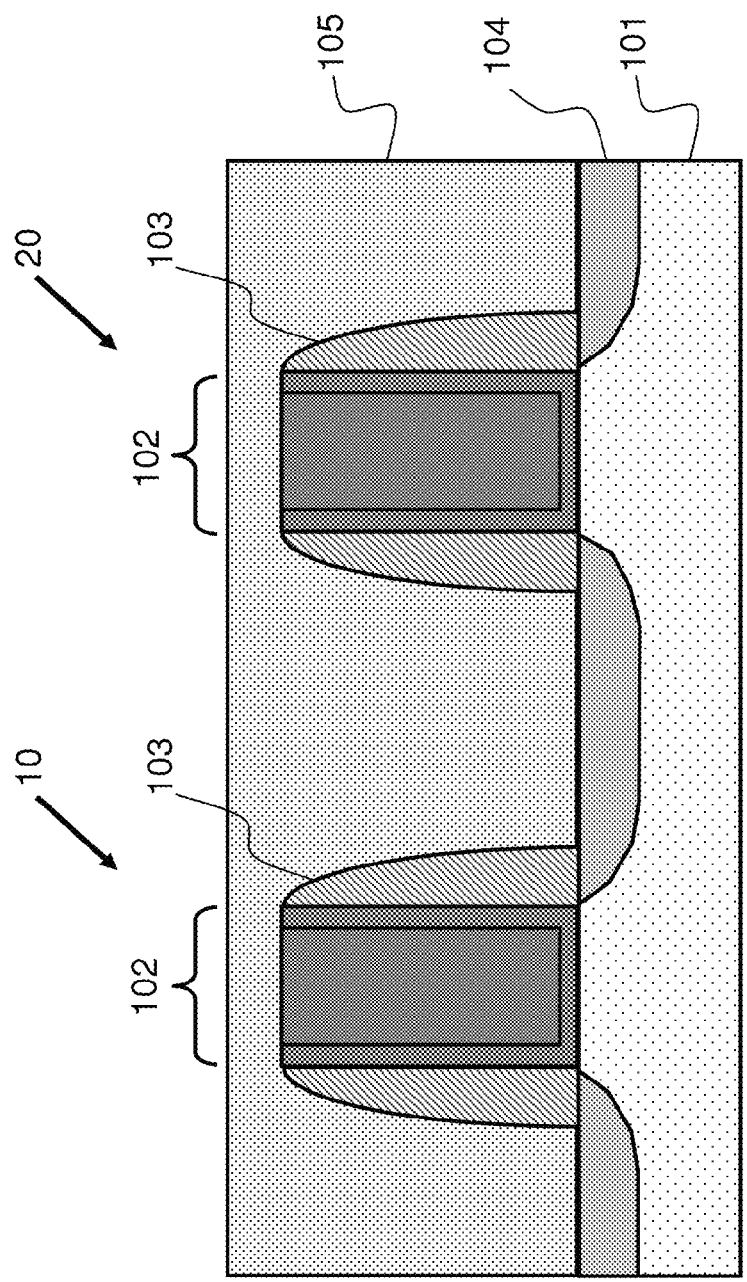
FIG. 1 is a demonstrative illustration of a method of forming contact structures for transistors according to an embodiment of the present invention.
Figure 2:
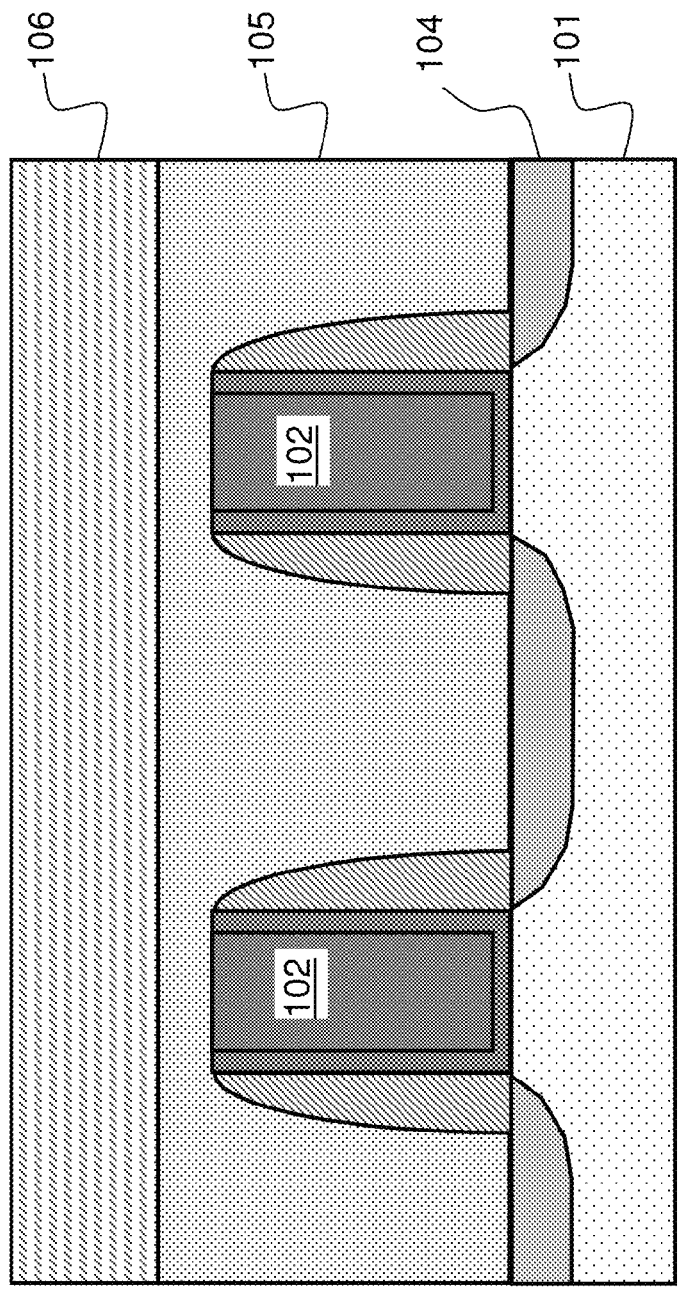
FIG. 2 is a demonstrative illustration of a method of forming contact structures for transistors, following the step illustrated in FIG. 1, according to an embodiment of the invention.
Figure 3:
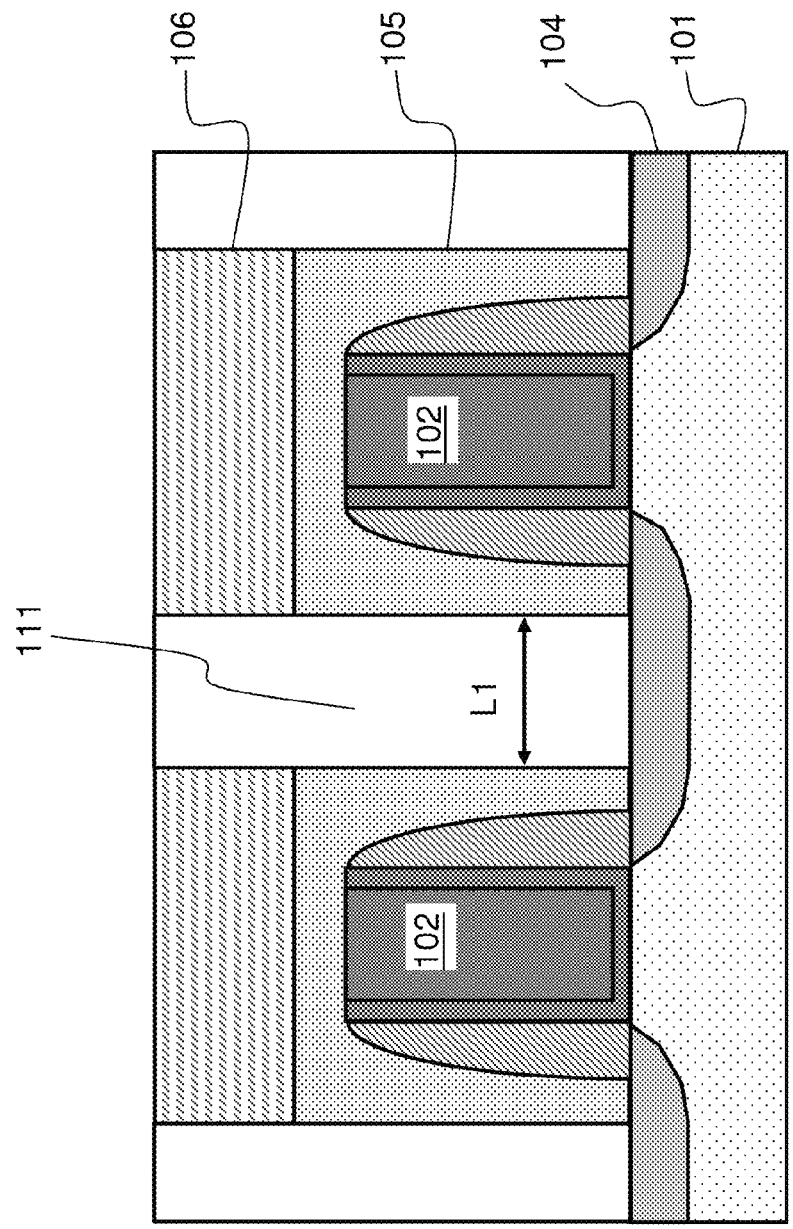
FIG. 3 is a demonstrative illustration of a method of forming contact structures for transistors, following the step illustrated in FIG. 2, according to an embodiment of the invention.
Figure 4:
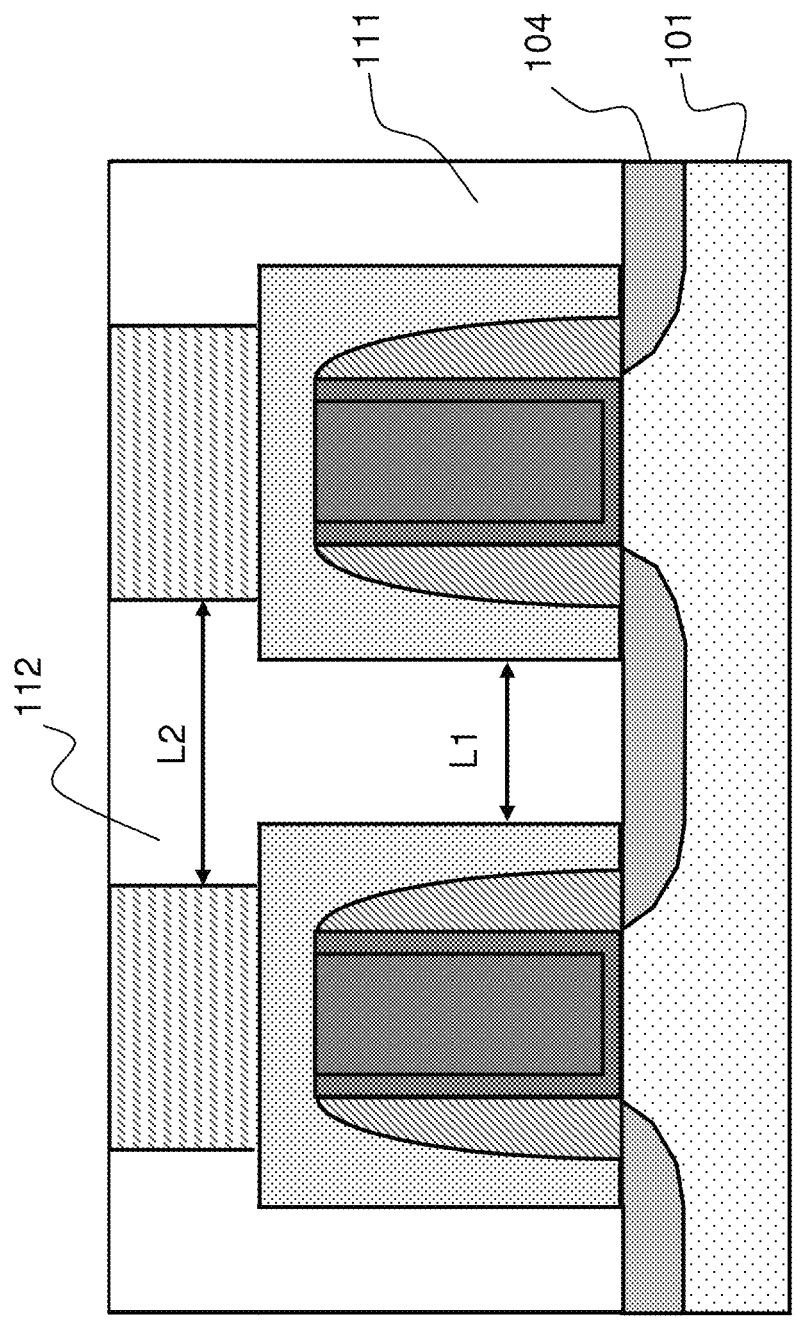
FIG. 4 is a demonstrative illustration of a method of forming contact structures for transistors, following the step illustrated in FIG. 3, according to an embodiment of the invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF EMBODIMENTS

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

The invention provides a method to reduce the silicide to source-drain interface resistance by increasing the silicide contact area. In the invention presented here, an epitaxial contact via is formed with a wider or larger contact size above the gate level, which defines the silicide to source-drain contact area. After the via opening, a heavily doped epitaxial film is grown and planarized. Then, silicide is selectively formed in the layers grown and the process proceeds with middle of line (MOL) processes. The advantage of this approach over other known approaches is that, by elevating the source/drain contacts to above the gate level, the contact area can be increased without the risk of shorting the contact to the gate electrode. Furthermore, with the contact electrode pulled "far" away from the source/drain junctions, the risk of contact-induced junction leakage is low or zero, which means that the contact silicide thickness does not need to be scaled down. This should improve not only the process window for silicide formation, but also the process window for forming low resistance contacts. Furthermore still, the increased contact area offered by this approach will reduce the variability in contact resistance and therefore the variability in device performance.

FIG. 1 is a demonstrative illustration of a method of forming contact structures for transistors according to an embodiment of the present invention. For example, one embodiment of the method may start with a structure having a first transistor 10 and a second transistor 20 formed on a substrate 101. First and second transistors 10 and 20 may respectively have a gate or gate structure 102 and spacers 103 formed at sidewalls of gate structures 102. Gate structures 102 and spacers 103 may be embedded in an inter-layer-dielectric (ILD) layer 105, which has a height that is at least the same or higher than that of gate structures 102 and spacers 103. First and second transistors 10 and 20 may also include source/drain regions 104 formed inside substrate 101 next to gate structures 102.

With the ever continuing scaling in real estate, first transistor 10 and second transistor 20 may be formed in close proximity and may share a common source/drain region in an area between their respective gate structures 102. Embodiments of present invention provide a contact structure that has reduced total silicide resistance, as being compared with those commonly known in the art.

FIGS. 2-6 are demonstrative illustrations of steps of a method of forming contact structures for transistors, following the step illustrated in FIG. 1, according to an embodiment of the invention. For example, one embodiment of the method includes forming, through deposition for example, a dielectric layer 106 on top of ILD layer 105 as being illustrated in FIG. 2. Dielectric layer 106, which may be referred to as an ILD layer as well, may be materially different from that of ILD layer 105. Selection of dielectric layers 105 and 106 may be made such that etch-selectivity, when forming via holes therein through etching, may be provided between dielectric layer 105 and dielectric layer 106. For example, if nitride is used in dielectric layer 105, layer 106 may be made of oxide or vise versus. Other types of dielectric materials may be used for layers 105 and 106 as well so long as proper etch-selectivity is made available.

Upon deposition of dielectric layer 106, one or more via holes may be made in spaces between gate structures of transistors where conductive contacts to transistors are to be formed. For example, in FIG. 3 a via hole 111 may be made between gate structures 102 of first and second transistors 10 and 20. Similar via holes may be formed in other areas of dielectric layers 105 and 106 wherever it is desirable. However, for the ease of description without any intent of losing generality, following description will be focused on forming contact in between gate structures 102 of transistors 10 and 20.

Via hole 111 between transistors 10 and 20 may be formed through a photo-lithographic patterning process. For example, a photo-resist pattern (not shown) may first be formed on top of dielectric layer 106. The pattern of photo-resist layer may then be transferred down into dielectric layer 106 and continually into dielectric layer 105 through an etching process such as a directional reactive-ion-etching (RIE) process. Via hole 111 formed thereby may have a width L1 and may expose source/drain region 104 between gate structures 102 of transistors 10 and 20. In one embodiment via hole 111 may be surrounded on the sidewalls by dielectric layers 105 and 106 without exposing spacers 103 of transistors 10 and 20. During the making of via hole 111, the RIE process is not specifically made to be selective to either dielectric layer 105 or dielectric layer 106 so long as both layers may be etched with relative ease.

After forming via hole 111, embodiment of present invention may include applying a second etching process to create another opening 112 that overlaps with and sits on top of via hole 111. The opening 112 may be formed only inside dielectric layer 106, through a selective etching process employing dielectric layer 105 as an etch-stop layer. As being illustrated in FIG. 4, opening 112 may have a width L2 that is wider than L1. In one embodiment, the selective etching process may create sidewalls of opening 112 that are substantially vertical, relative to substrate 101, as being illustrated in FIG. 4. In another embodiment, conditions of the selective etching process may be carefully adjusted and/or controlled to create tapered sidewalls, as those sidewalls being illustrated in FIG. 11 associated with another embodiment. Sidewalls of other shapes are possible embodiments of present invention as well. In any case, via hole 112 may have a width that is wider than that of via hole 111.

Moreover, a person skilled in the art will appreciate that the formation of via holes 111 and 112 may be achieved through other means such as other damascene processes. For example, the wider via hole 112 may first be formed through etching inside dielectric layer 106. It is then followed by a process of forming the narrower via hole 111 inside dielectric layer 105 via the opening of via hole 112. Different dielectric materials are used for layers 105 and 106 here solely for the purpose of etch-selectivity. However, same material may be used for dielectric layers 105 and 106 should a via hole with a bigger opening at an upper portion and a smaller opening at a lower portion of a dielectric layer may be formed through a currently existing or future developed technique. For example, a tapered opening may be formed inside a single dielectric layer with a smaller opening at the bottom exposing source/drain region 104 and a bigger opening at the top surface of the dielectric layer.

Following the creation of via holes 111 and 112, semiconductor material may be epitaxially grown in the opening to form a first epitaxial-grown region 121 inside via hole 111 in dielectric layer 105, and subsequently a second epitaxial-grown region 122 inside via hole 112 in dielectric layer 106. The epitaxially grown semiconductor material may include, as non-limiting examples, silicon-based material, germanium-based material, and/or III-V semiconductor material. Epitaxial-grown region 122 may have a width L2, defined by the width of via hole 112, that is larger than that of first epitaxial-grown region 121 which is defined by the width of via hole 111. Moreover, according to one embodiment, because via hole 112 is formed inside dielectric layer 106 that is on top of dielectric layer 105 which is higher that a top surface of gate structures 102, second epitaxial-grown region 122 is formed at a level that is above the top surface of gate structures 102 of first and second transistors 10 and 20.

According to one embodiment, via hole 112 may be created to be sufficiently wide, to be substantially close to, vertically, or on top of spacers 103 and/or even partially on top of gate structures 102 of both transistor 10 and transistor 20. After epitaxially growing semiconductor material inside via hole 112, in one embodiment epitaxial-grown region 122 is at least partially formed on top of spacers 103 and, in another embodiment, may be partially formed on top of gate structures 102 of first and second transistors 10 and 20.

Following the epitaxial growing process that fills via hole 111 and via hole 112 with, for example, silicon-material, silicide may be formed in a top portion of epitaxial-grown region 122. For example, in a process of forming silicide 131 as in FIG. 6, such as nickel-silicide, a layer of nickel may first be deposited on top of epitaxial-grown region 122. The nickel-deposited epitaxial-grown region 122 may subsequently be subjected to a thermal annealing process, under proper temperature and duration, which causes nickel to diffuse into the top portion of epitaxial-grown region 122 and be bound with silicon inside the epitaxial-grown region 122, thereby forming nickel-silicide 131. Other types of conductive metal element may be used to form other types of silicide as well.

Figure 6:
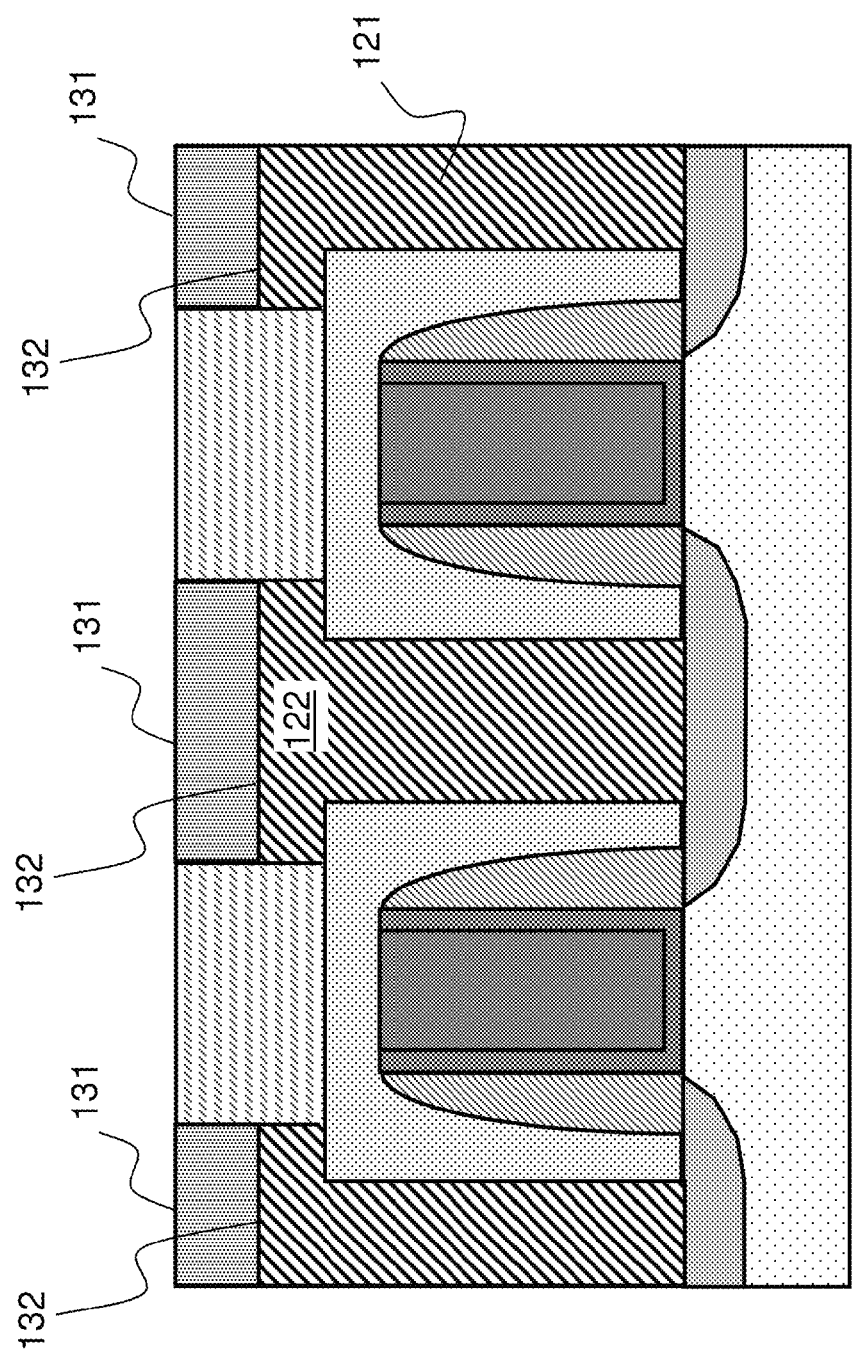
FIG. 6 is a demonstrative illustration of a method of forming contact structures for transistors, following the step illustrated in FIG. 5, according to an embodiment of the invention.

As being demonstratively illustrated in FIG. 6, silicide 131 may be formed in a top portion of epitaxial-grown region 122 to have an interface 132 with rest portion of epitaxial-grown region 122. Silicide 131 has an interface area 132 whose width L2 is wider than width L1 of a top surface or cross-section of epitaxial-grown region 121. When being comparing with a silicide which would otherwise be formed directly in the exposed area of source/drain region 104 with a width L1, the increased interface area 132 helps reducing a total silicide resistance between the silicide and the source/drain region 104.

Figure 5:
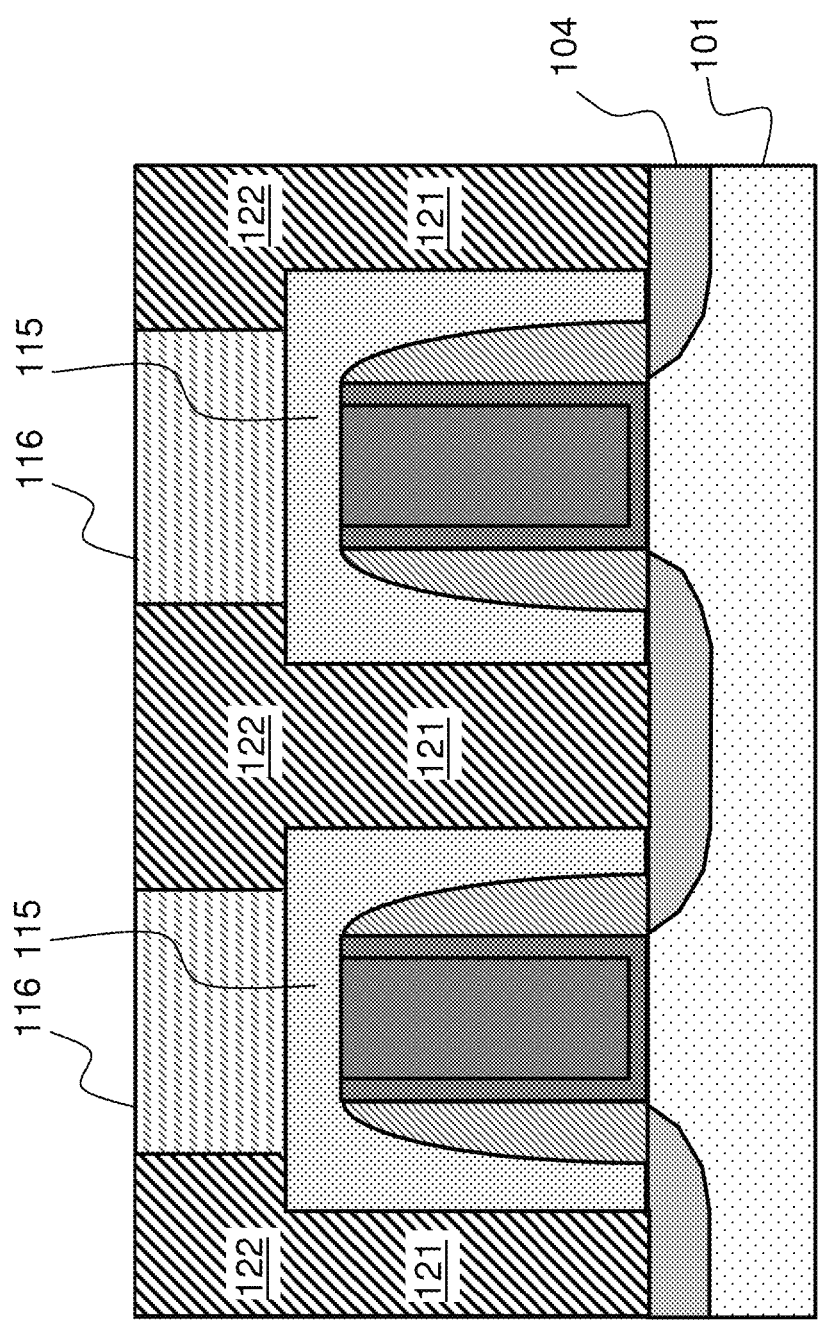
FIG. 5 is a demonstrative illustration of a method of forming contact structures for transistors, following the step illustrated in FIG. 4, according to an embodiment of the invention.
Figure 7:
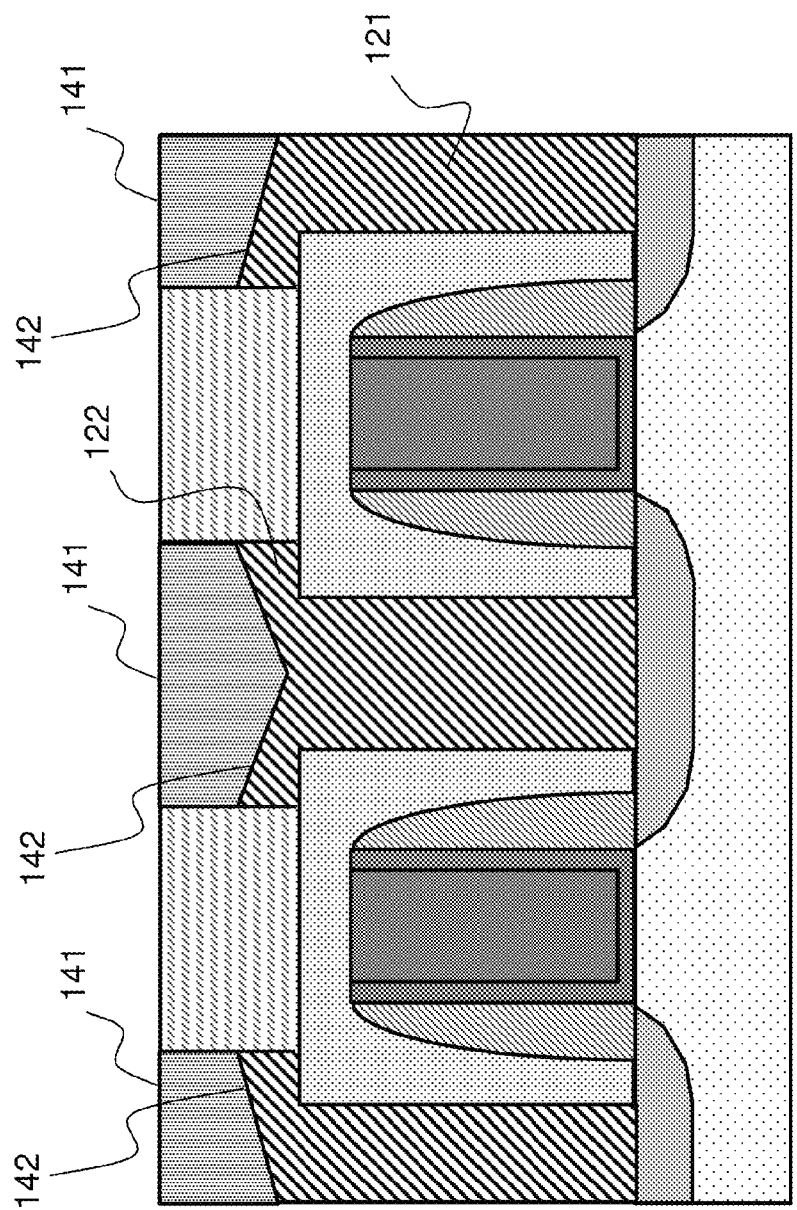
FIG. 7 is a demonstrative illustration of a method of forming contact structures for transistors, following the step illustrated in FIG. 5, according to another embodiment of the invention.
Figure 8:
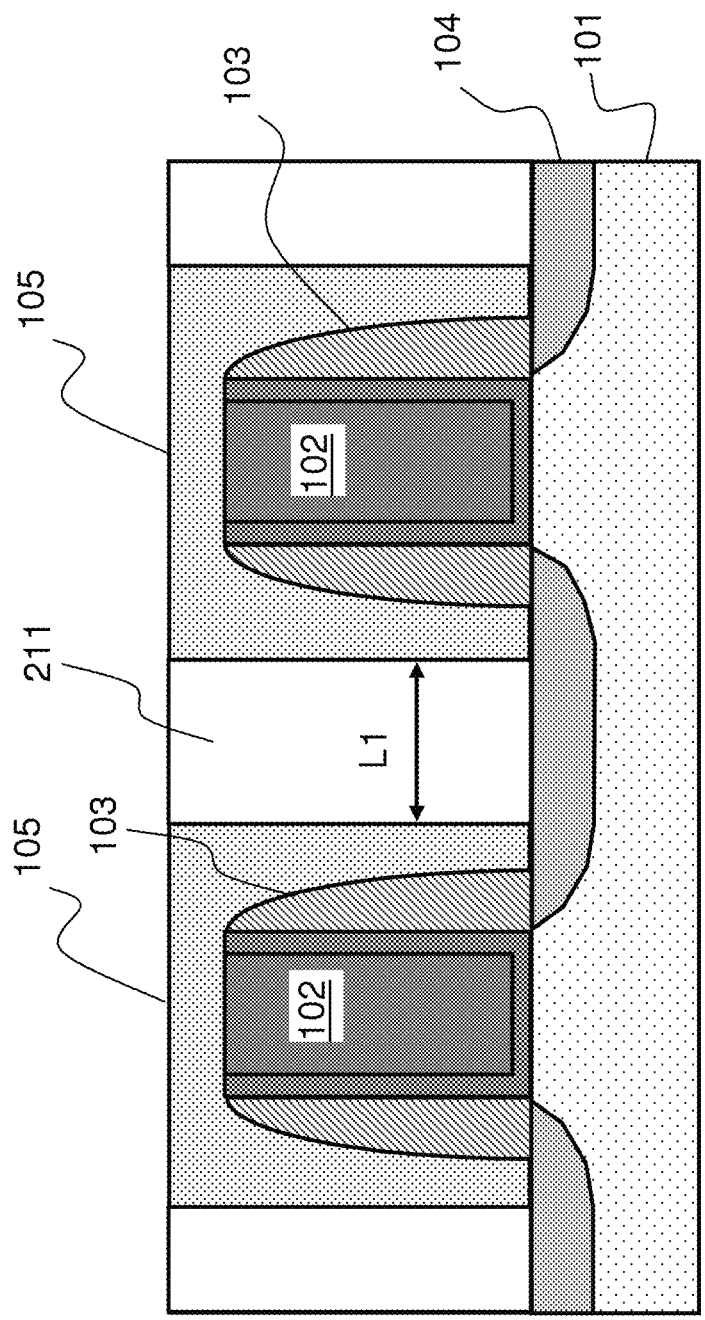
FIG. 8 is a demonstrative illustration of a method of forming contact structures for transistors, following the step illustrated in FIG. 1, according to an embodiment of the invention.

FIG. 7 is a demonstrative illustration of a method of forming contact structures for transistors, following the step illustrated in FIG. 5, according to another embodiment of the invention. In this embodiment, a silicide 141 with a multi-facet interface 142, instead of a flat interface 132 as illustrated in FIG. 6, may be formed. According to one embodiment of present invention, interface 142 of silicide 141, with its multiple facets, has a total combined width that is wider than the width of epitaxial-grown region 122. The increased silicide interface width 142, therefore a total combined interface area, helps further reduce the total silicide resistance between silicide 141 and source/drain region 104, as being compared with silicide 131 in FIG. 6.

FIGS. 8-13 are demonstrative illustrations of steps of a method of forming contact structures for transistors, following the step illustrated in FIG. 1, according to another embodiment of the invention. For example, following the step shown in FIG. 1, a via hole 211 may be formed inside ILD layer 105. Via hole may have a width L1, expose source/drain region 104 in substrate 101, and is isolated from gate structures 102 by ILD layer 105.

Figure 9:
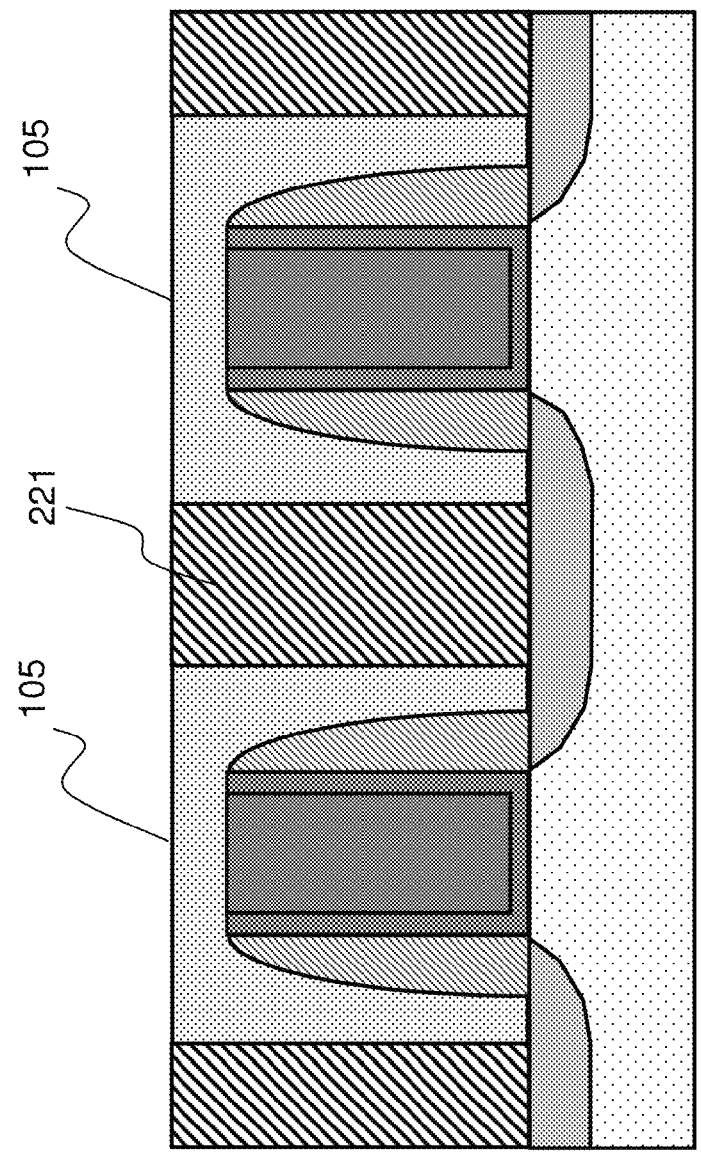
FIG. 9 is a demonstrative illustration of a method of forming contact structures for transistors, following the step illustrated in FIG. 8, according to an embodiment of the invention.

After the formation of via hole 211, semiconductor material including, for example, silicon-based material, germanium-based material, and/or III-V semiconductor material may be epitaxially grown inside via hole 211 to form a first epitaxial-grown region 221, as being illustrated in FIG. 9. First epitaxial-grown region may have a width L1, as being defined by via hole 211, and a height that is higher than that of first and second gate structures 102 of first and second transistors 10 and 20.

Figure 10:
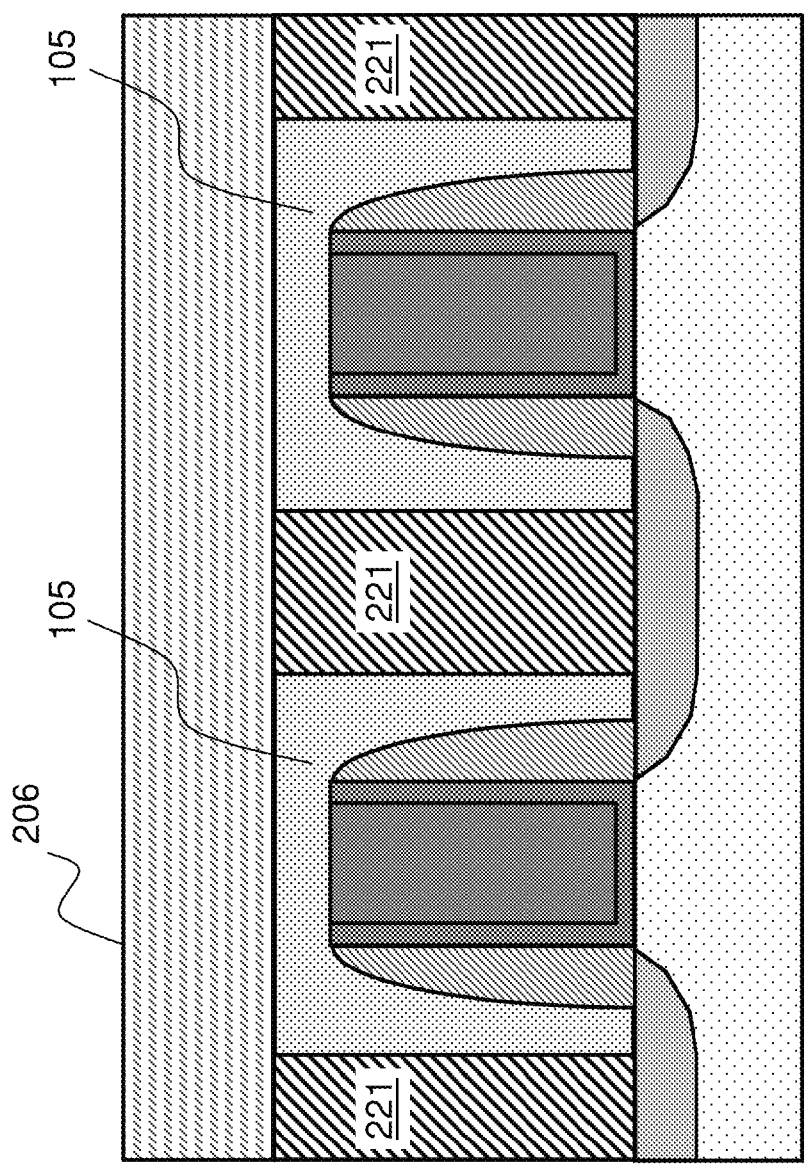
FIG. 10 is a demonstrative illustration of a method of forming contact structures for transistors, following the step illustrated in FIG. 9, according to an embodiment of the invention.

Following the epitaxial-growth of epitaxial-grown region 211, another dielectric layer 206 may be formed through for example deposition on top of dielectric layer 105 covering both dielectric layer 105 and epitaxial-grown region 221, as being illustrated in FIG. 10. Before the deposition, a chemical-mechanic-polishing (CMP) process may be employed to prepare the top surface of dielectric layer 105 for the deposition. Material of dielectric layer 206 may be different from that of dielectric layer 105 in order to provide etch-selectivity during a process of creating via holes inside dielectric layer 206, using dielectric layer 105 as an etch-stop layer. However, embodiment of the present invention is not limited in this respect and same dielectric material may be used for both dielectric layers 105 and 106, and other processes, such as a timed etching process, may be employed in the creation of via holes inside dielectric layer 206 without the help of etch-selectivity.

Figure 11:
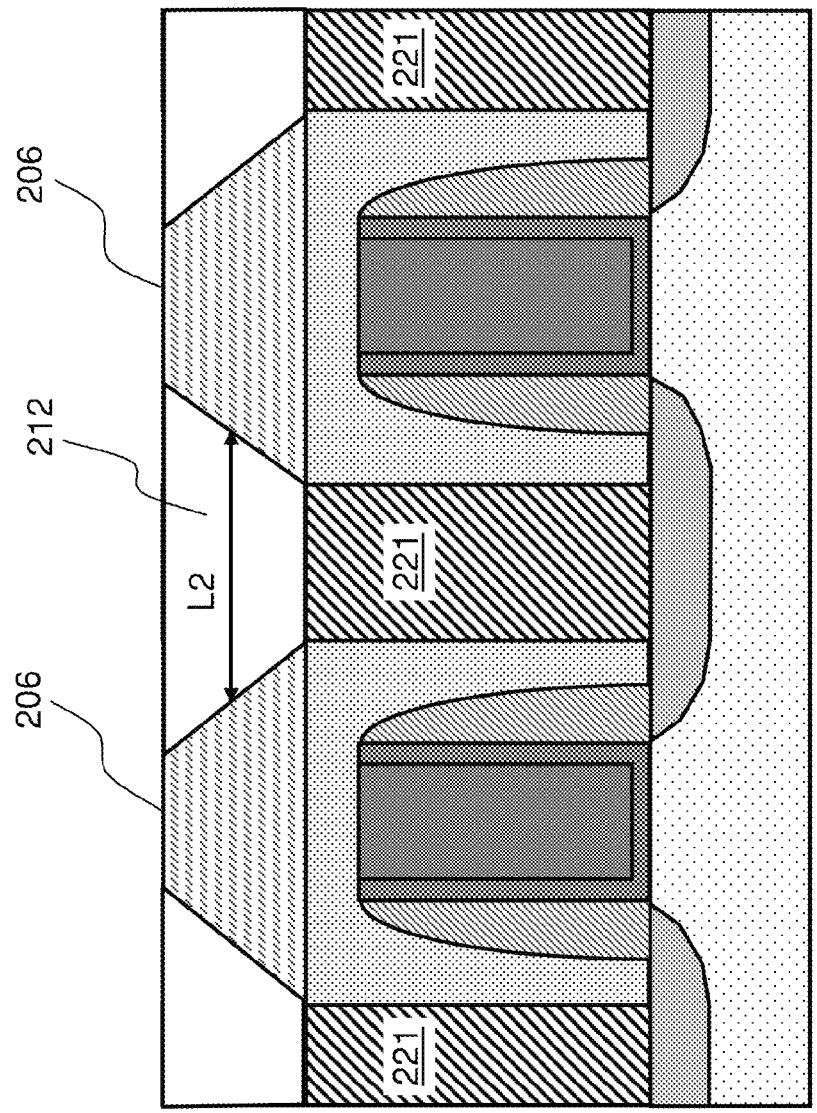
FIG. 11 is a demonstrative illustration of a method of forming contact structures for transistors, following the step illustrated in FIG. 10, according to an embodiment of the invention.

Following the deposition of dielectric layer 206, via hole 212 may be created inside dielectric layer 206, as being demonstratively illustrated in FIG. 11. Via hole 212 may be created directly on top of and therefore may expose epitaxial-grown region 221 underneath thereof. Via hole 212 may be formed, through etching or other existing or future developed technique, to have different vertical shapes. For example, via hole 212 may have the shape of a funnel and have tapered sidewalls, as being demonstratively illustrated in FIG. 11, or have other shapes such as the shape shown in FIG. 4. Via hole 212 may have a width L2, which may vary along the height thereof, that is wider than L1 of via hole 211, as being illustrated in FIG. 8. In other words, via hole 212 has a width that is wider than the width of epitaxial-grown region 221.

Figure 12:
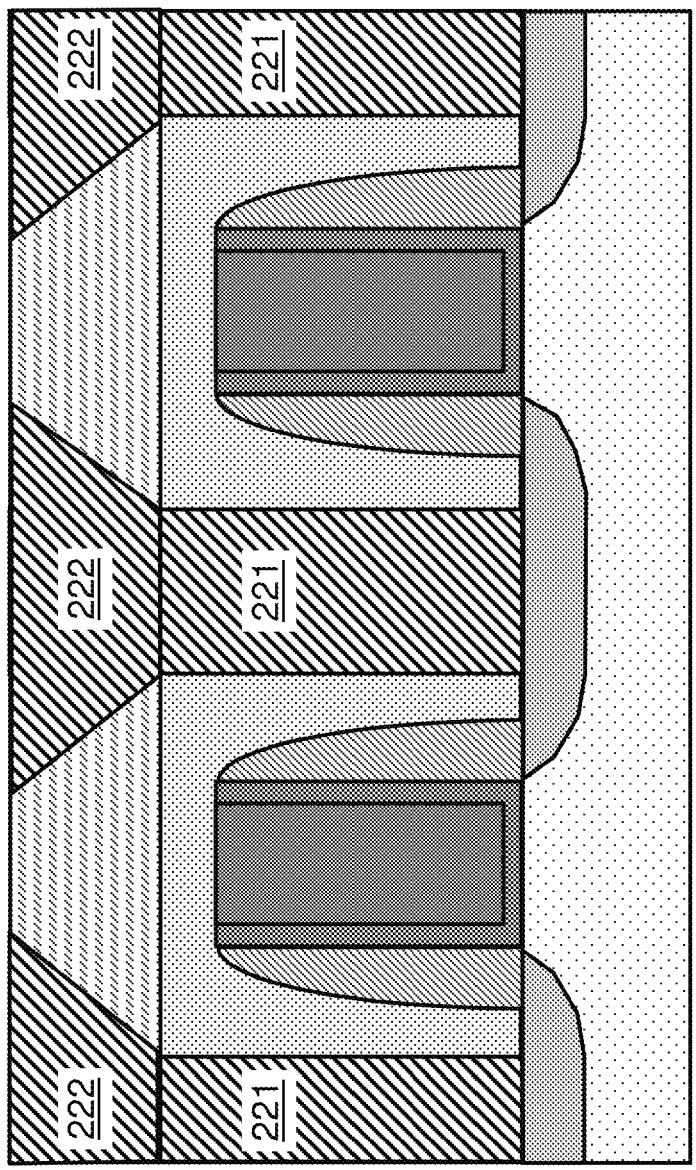
FIG. 12 is a demonstrative illustration of a method of forming contact structures for transistors, following the step illustrated in FIG. 11, according to an embodiment of the invention.

After exposing epitaxial-grown region 221 through via hole 212, another semiconductor material, which may be same as or different from the semiconductor material that fills via hole 211, may be grown epitaxially inside via hole 212 to form a second epitaxial-grown region 222 as being illustrated in FIG. 12. In one embodiment, epitaxial-grown region 222 may have a top and a bottom surfaces with the top surface being larger than the bottom surface. The bottom surface, which interfaces directly with epitaxial-grown region 221, may have a comparable size of area with that of epitaxial-grown region 221. Cross-section of epitaxial-grown region 222 changes or increases along a height thereof.

Figure 13:
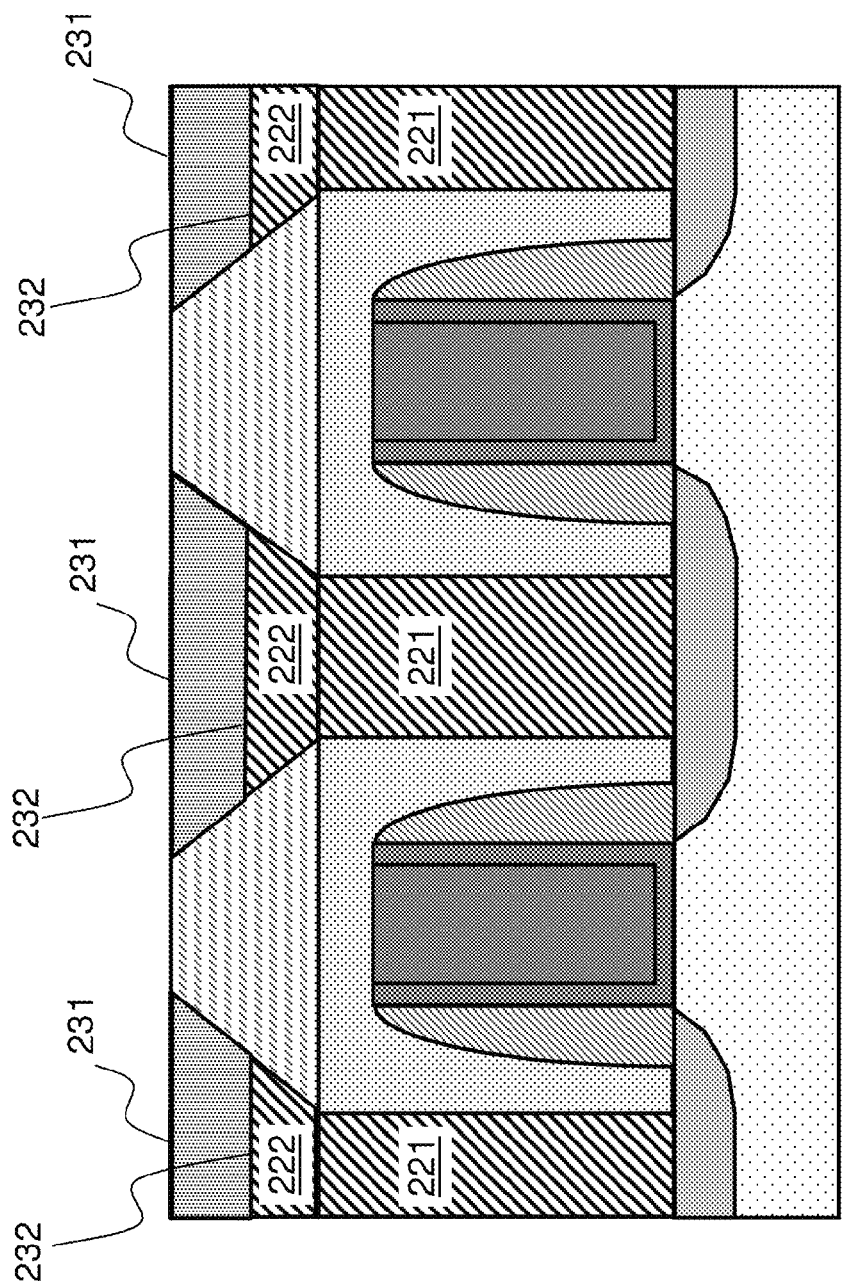
FIG. 13 is a demonstrative illustration of a method of forming contact structures for transistors, following the step illustrated in FIG. 12, according to an embodiment of the invention.

Following the epitaxial-growth of, for example, silicon-based material inside via hole 212, silicide 231 may be formed on a top portion of epitaxial-grown region 222, as being demonstratively illustrated in FIG. 13. Silicide 231 may have an interface 232 with rest of epitaxial-grown region 222, and interface 232 may have a width larger that the width of epitaxial-grown region 221. In one embodiment, interface 232 of silicide 231 may be formed to have multiple facets, similar to interface 142 as being illustrated in FIG. 7, or curved such as elliptical or circular shape to have a total combined width that is even wider than that of epitaxial-grown region 222. According to embodiment of the present invention, increased interface areas of silicide 231 may reduce a total resistance of silicide and help improve performance of transistors 10 and 20.

Figure 14:
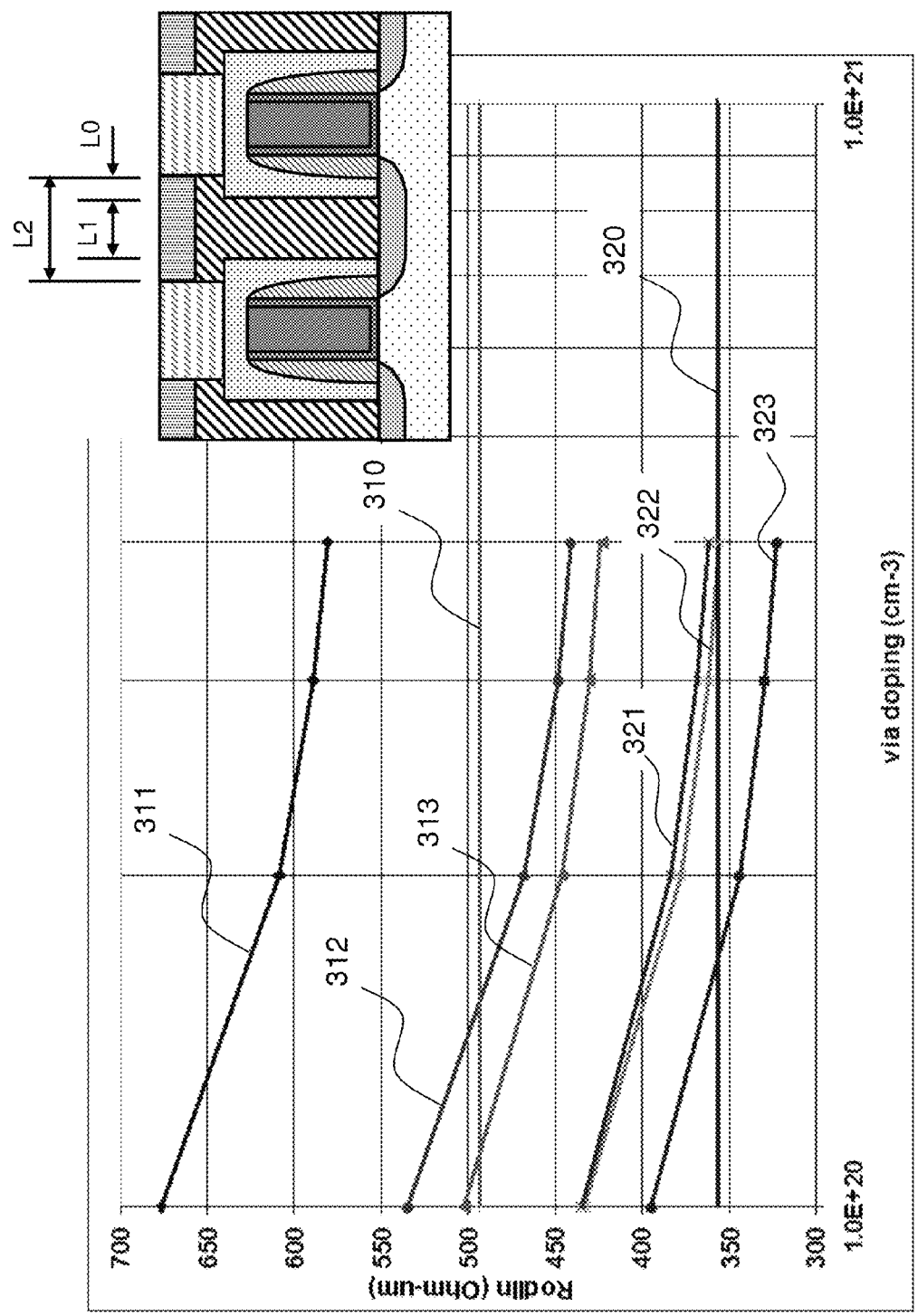
FIG. 14 is a chart showing simulated resistance of source/drain contact structures according to an embodiment of the invention.

FIG. 14 is a chart showing simulated resistance of source/drain contact structures according to an embodiment of the invention. The simulation is based upon a 3-D FinFET structure with a gate length around 18 nm. Simulation results are shown for structures with elevated source/drain contacts (311-313, 321-323) and are compared with results for structures with "conventional" non-elevated contacts (310, 320), whose contact interface is generally co-planar with the channel surface. X-axis in FIG. 14 denotes an epitaxial doping concentration made in the elevated source/drain contact regions and y-axis denotes an on-resistance Rodlin simulated at Vds=50 mV and Vgs−Vt=500 mV. Simulations were made for elevated contacts with various amount of flare-out, which is denoted by L0 in the inlet in FIG. 14. In other words, L0 equals to (L2−L1)/2 with L1 being a width of the lower epitaxial-grown region, fixed at 10 nm, and L2 being a width of the upper epitaxial-grown region. Two sets of simulation results are shown in FIG. 14.

Assuming a contact resistivity between silicide and elevated source/drain region of 1 e-8 Ohm-cm2, Rodlin in a conventional contact (310) is estimated to be around 490 Ohm-um. With elevated contacts at different flare-out such as zero flare-out (311), 5 nm flare-out (312), and 12 nm flare-out, Rodlin generally decreases with the increase of epitaxial doping concentration. For example, with an epitaxial doping concentration being equal or bigger than 2 E20 cm-3, when elevated contacts have flare-out, whether at 5 nm (312) or 12 nm (313), Rodlin is estimated to drop to as low as around 430 Ohm-um, which represents approximately 12% reduction in Rodlin when being compared with 490 Ohm-um in a conventional contact (310). This is due to the increase in contact area offered by the amount of flare-out, which more than offsets the added series resistance path through the epitaxial vias.

In another set of simulation, a contact resistivity of 5 E-9 Ohm-cm2 is used. A conventional contact (320) is estimated to have approximately 355 Ohm-um resistance. When elevated source/drain contact is used, as being illustrated by curves 321, 322, and 323 which respectively represent a flare-out amount of 0, 5, and 12 nm, the overall contact resistance Rodlin decreases with the increase of epitaxial doping concentration, and in the situation of flare-out amount of 12 nm, a reduction to around 320 Ohm-um at a doping concentration around 4 E20 cm-3 is achieved, which represents approximately 10% reduction from the conventional contact resistance of 355 Ohm-um.

Here, it is worth noting that as silicide contact area becomes smaller and smaller, it becomes harder and harder to achieve low contact resistivity at the silicide interface. This is at least partly because that, for a small contact area, the area is no longer planar and is often confined to one or a small number of metal grains, with each possibly having a different crystal plane orientation. Each of the metal grains presents a different barrier height to incoming current carriers. When it is at a large scale, variation of the metal grains may be averaged out over many metal grains. However, when it is at small scales, these metal grains lead to increased variation in barrier heights. Normally, variation in barrier heights may be reduced through dopant segregation, but for small contact areas with small silicide thickness, less dopant segregation or dopant pile-up effect during silicide formation may be expected. Therefore, in reality, it is more likely for a "conventional" non-elevated contact to achieve a contact resistivity of 1 E-8 Ohm-cm2 (line 310) than to achieve 5 E-9 Ohm-cm2 (line 320), leaving more room for on-resistance Rodlin improvement through elevated contact as in the present invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
providing a semiconductor substrate having a first and a second gate structure of a first and a second transistor formed on top thereof, said first and second gate structures being embedded in a first inter-layer-dielectric (ILD) layer;
epitaxially forming a first semiconductor region between said first and second gate structures inside said first ILD layer;
epitaxially forming a second semiconductor region directly on top of said first semiconductor region, said second semiconductor region being inside a second ILD layer that is on top of said first ILD layer and having a width wider than a width of said first semiconductor region; and
forming a silicide in a top portion of said second semiconductor region,
wherein epitaxially forming said first and second semiconductor regions comprises:
etching a first via hole inside said first ILD layer between said first and second gate structures;
epitaxially growing said first semiconductor region inside said first via hole;
depositing said second ILD layer on top of said first ILD layer as well as on top of said first semiconductor region;
etching a second via hole inside said second ILD layer in an etching process selective to said first ILD layer, said second via hole, at a bottom thereof, being equal to or bigger than a cross-sectional area of said first semiconductor region; and
epitaxially growing said second semiconductor region inside said second via hole.

2. The method of claim 1, wherein etching said second via hole comprises forming said second via hole to have a funnel shape with tapered sidewalls.

3. The method of claim 2, wherein a bottom cross-section of said funnel shape is at least as big as a cross-section of said first semiconductor region, said first semiconductor region being isolated from said first and second gate structures by said first ILD layer and said cross-section thereof being uniform from a top surface to a bottom surface of said first semiconductor region.

4. The method of claim 1, wherein forming said silicide further comprises forming said silicide to have an interface with rest of said second semiconductor region, said interface having multiple facets and a total combined width of said multiple facets being wider than a width of said second semiconductor region.

5. A method comprising:
providing a semiconductor substrate;
forming a first and a second field-effect-transistors to have a first and a second gate structure located on top of said semiconductor substrate;
covering said first and second gate structures with a first inter-layer-dielectric (ILD) layer;
forming a first silicon region between said first and second gate structures inside said first ILD layer;
forming a second silicon region directly on top of said first silicon region, said second silicon region being inside a second ILD layer on top of said first ILD layer and having a width wider than a width of said first silicon region; and
forming a silicide in a top portion of said second silicon region,
wherein forming said first and second silicon regions comprises:
etching a first opening inside said first ILD layer;
epitaxially growing said first silicon region inside said first opening;
depositing said second ILD layer on top of said first ILD layer as well as on top of said first silicon region;
etching a second opening inside said second ILD layer in an etching process selective to said first ILD layer, said second opening being equal to or bigger than a cross-section area of said first silicon region; and
epitaxially growing said second silicon region inside said second opening.

6. The method of claim 5, wherein etching said second opening comprises forming said second opening to have a funnel shape with tapered sidewalls, said funnel shape being formed directly on top of said first silicon region.

7. The method of claim 6, wherein a bottom cross-section area of said funnel shape is at least as big as said cross-section area of said first silicon region, said first silicon region being isolated from said first and second gate structures by said first ILD layer, said cross-section area of said first silicon region being uniform from a top to a bottom surface thereof.

8. The method of claim 5, wherein forming said silicide further comprises forming said silicide to have an interface with rest of said second silicon region, said interface having at least two facets and a total combined width of said two facets being wider than a width of said second silicon region.

* * * * *